United States Patent
Marchand

(10) Patent No.: US 7,388,372 B2
(45) Date of Patent: Jun. 17, 2008

(54) ELECTRICAL SYSTEM WITH MAGNETORESISTIVE SENSORS

(75) Inventor: David Gregory Marchand, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 11/443,054

(22) Filed: May 31, 2006

(65) Prior Publication Data

US 2007/0279052 A1    Dec. 6, 2007

(51) Int. Cl.
*G01R 19/00* (2006.01)
*G01R 17/10* (2006.01)
*G01R 33/025* (2006.01)
*G01R 33/09* (2006.01)

(52) U.S. Cl. .................. 324/252; 324/117 R; 324/126

(58) Field of Classification Search ............... 324/98, 324/99 R, 117 R, 117 H, 126, 127, 252
See application file for complete search history.

(56) References Cited

U.S. PATENT DOCUMENTS

| | | | |
|---|---|---|---|
| 4,385,273 A | 5/1983 | Lienhard et al. | |
| 4,385,283 A | 5/1983 | Delapierre | |
| 4,464,625 A | 8/1984 | Lienhard et al. | |
| 4,525,668 A | 6/1985 | Lienhard et al. | |
| 4,596,950 A * | 6/1986 | Lienhard et al. | 324/117 R |
| 4,857,837 A | 8/1989 | Baran et al. | |
| 4,937,521 A | 6/1990 | Yoshino et al. | |
| 5,247,278 A | 9/1993 | Pant et al. | |
| 5,621,377 A * | 4/1997 | Dettmann et al. | 338/32 R |
| 5,767,668 A * | 6/1998 | Durand | 324/117 R |
| 5,933,003 A * | 8/1999 | Hebing et al. | 324/117 R |
| 5,952,825 A | 9/1999 | Wan | |
| 6,356,851 B1 | 3/2002 | Young et al. | |
| 6,433,545 B1 | 8/2002 | Kunze et al. | |
| 6,872,467 B2 | 3/2005 | Qian et al. | |
| 6,949,927 B2 | 9/2005 | Goetz | |
| 7,239,123 B2 * | 7/2007 | Rannow et al. | 324/117 R |

(Continued)

FOREIGN PATENT DOCUMENTS

WO    WO 99/06844    2/1999

OTHER PUBLICATIONS

Honeywell, "Set/Reset Function for Magnetic Sensors," printed from the internet on Apr. 10, 2006, pp. 1-8.

(Continued)

*Primary Examiner*—Jay M Patidar
(74) *Attorney, Agent, or Firm*—Finnegan, Henderson, Farabow, Garrett & Dunner

(57) ABSTRACT

An electrical system includes a first monolithic circuit. The first monolithic circuit may include a first magnetoresistive sensor operable to sense magnetic flux and produce an output signal relating to the sensed magnetic flux. The first magnetoresistive sensor may be positioned to sense first control flux generated by control current in one or more electrical conductors of the first monolithic integrated circuit. Additionally, the first magnetoresistive sensor may be positioned to sense flux generated by sensed electric current flowing through one or more additional electrical conductors. The electrical system may also include a control circuit operable to receive the output signal of the first magnetoresistive sensor and adjust the control current that generates the first control flux in a manner to cause the output signal from the first magnetoresistive sensor to substantially coincide with a predetermined target.

25 Claims, 4 Drawing Sheets

U.S. PATENT DOCUMENTS

2004/0155644 A1   8/2004   Stauth et al.
2006/0061350 A1   3/2006   Myers et al.
2006/0087318 A1*  4/2006   Crolly et al. ............... 324/252

OTHER PUBLICATIONS

Honeywell, "Handling Sensor Bridge Offset," printed from the internet on Apr. 10, 2006, pp. 1-6.
Honeywell, "1-and 2-Axis Magnetic Sensors," printed from the internet on Apr. 10, 2006, pp. 1-15.
Honeywell, "Magnetic Current Sensing," printed from the internet on Apr. 10, 2006, pp. 1-7.
Olson, E.R. et al: "Using the Dynamic Behavior of Superimposed Fields for Point Field-Based Current Sensing". Applied Power Electronics Conference & Exposition, 2006, 21st Annual IEEE Mar. 19, 2006, Piscataway, NJ, pp. 580-586, XP010910003. ISBN 0-7803-9547-6.
Duron, J. et al: "Dynamic Field Mapping for Obtaining the Current Distribution in High-Temperature Superconducting Tapes". IEEE Transactions on Applied Superconductivity, IEEE Service Center, Los Alamitos, CA, vol. 15, No. 2, Jun. 2005, pp. 3644-3647, XP011134476. ISSN: 1051-8223.
Marchand, David G., U.S. Appl. No. 11/443,093, filed May 31, 2006.
European Patent Office, PCT International Search Report and Written Opinion mailed Mar. 3, 2008 for international application number PCT/US2007/008494.

* cited by examiner

ELECTRICAL SYSTEM WITH MAGNETORESISTIVE SENSORS

TECHNICAL FIELD

The present disclosure relates to electrical systems and, more particularly, to electrical systems utilizing magnetoresistive sensing.

BACKGROUND

Electrical systems transmit electric current through electrical conductors in order to perform many tasks. Many applications of electrical systems may require sensing of the magnitude of electric current flowing through one or more electrical conductors. Some electrical systems sense the electric current in an electrical conductor with a magnetoresistive sensor that senses the magnetic flux produced by the electric current and produces an output signal related to the magnitude of the magnetic flux and, thus, the magnitude of the electric current. Unfortunately, a magnetoresistive sensor may be able to accurately sense only a limited range of magnetic flux intensity. As a result, many electrical systems that employ a magnetoresistive sensor for current sensing are able to accurately sense only a limited range of electric current using the magnetoresistive sensor.

U.S. Pat. No. 4,525,668 to Lienhard et al. ("the '668 patent") shows a current-sensing method that includes sensing magnetic flux from both an unknown current and a control current with a magnetoresistive sensor, while using the control current to maintain the total magnetic flux sensed by the magnetoresistive sensor substantially equal to zero. The '668 patent discloses an electrical system that includes a first electrical conductor carrying the unknown current adjacent the magnetoresistive sensor. A second electrical conductor disposed adjacent the magnetoresistive sensor carries the controlled current. The electrical system of the '668 patent further includes an operational amplifier connected between the magnetoresistive sensor and the second electrical conductor. The operational amplifier receives the output signal of the magnetoresistive sensor and controls the magnitude of the control current in the second electrical conductor in such a manner that magnetic flux from the control current substantially cancels magnetic flux from the unknown current at the magnetoresistive sensor. The electrical system of the '668 patent includes additional analog components that use the control current to generate a signal indicative of the magnitude of the unknown current.

Although the system of the '668 patent includes provisions for sensing electric current with a magnetoresistive sensor while maintaining the total magnetic flux sensed by the magnetoresistive sensor substantially equal to zero, certain disadvantages persist. For example, the electrical system of the '668 patent may be undesirably expensive because of the component costs associated with separately providing the magnetoresistive sensor and the second electrical conductor. Additionally, precisely positioning the second electrical conductor with respect to the magnetoresistive sensor so as to ensure proper operation of the electrical system may be difficult and expensive. Furthermore, the analog components of the electrical system of the '668 patent may indicate the magnitude of the unknown electric current with relatively low resolution.

The electrical systems and methods of the present disclosure solve one or more of the problems set forth above.

SUMMARY OF THE INVENTION

One disclosed embodiment relates to an electrical system having a first monolithic circuit. The first monolithic circuit may include a first magnetoresistive sensor operable to sense magnetic flux and produce an output signal relating to the sensed magnetic flux. The first magnetoresistive sensor may be positioned to sense first control flux generated by control current in one or more electrical conductors of the first monolithic integrated circuit. Additionally, the first magnetoresistive sensor may be positioned to sense flux generated by sensed electric current flowing through one or more additional electrical conductors. The electrical system may also include a control circuit operable to receive the output signal of the first magnetoresistive sensor and adjust the control current that generates the first control flux in a manner to cause the output signal from the first magnetoresistive sensor to substantially coincide with a predetermined target.

Another embodiment relates to a method of operating an electrical system. The method may include using a first magnetoresistive sensor that is part of a first monolithic integrated circuit to sense magnetic flux and produce an output signal relating to the sensed magnetic flux, including sensing magnetic flux generated by sensed electric current in one or more electrical conductors. The method may also include causing the output signal of the first magnetoresistive sensor to substantially coincide with a predetermined target by supplying control current to one or more electrical conductors of the first monolithic integrated circuit in a manner to generate first control flux that at least partially offsets the magnetic flux from the sensed electric current.

A further embodiment relates to an electrical system having a magnetoresistive sensor operable to sense magnetic flux and provide an output signal relating to the sensed magnetic flux. The magnetoresistive sensor may be positioned to sense magnetic flux generated by sensed electric current flowing through one or more electrical conductors. The magnetoresistive sensor may also be positioned to sense control flux generated by control current flowing through one or more additional electrical conductors. Additionally, the electrical system may include a control circuit having a digital information processor operable to adjust the control current in the one or more additional electrical conductors in a manner to substantially coincide with a predetermined target.

DETAILED DESCRIPTION

Figure 1:
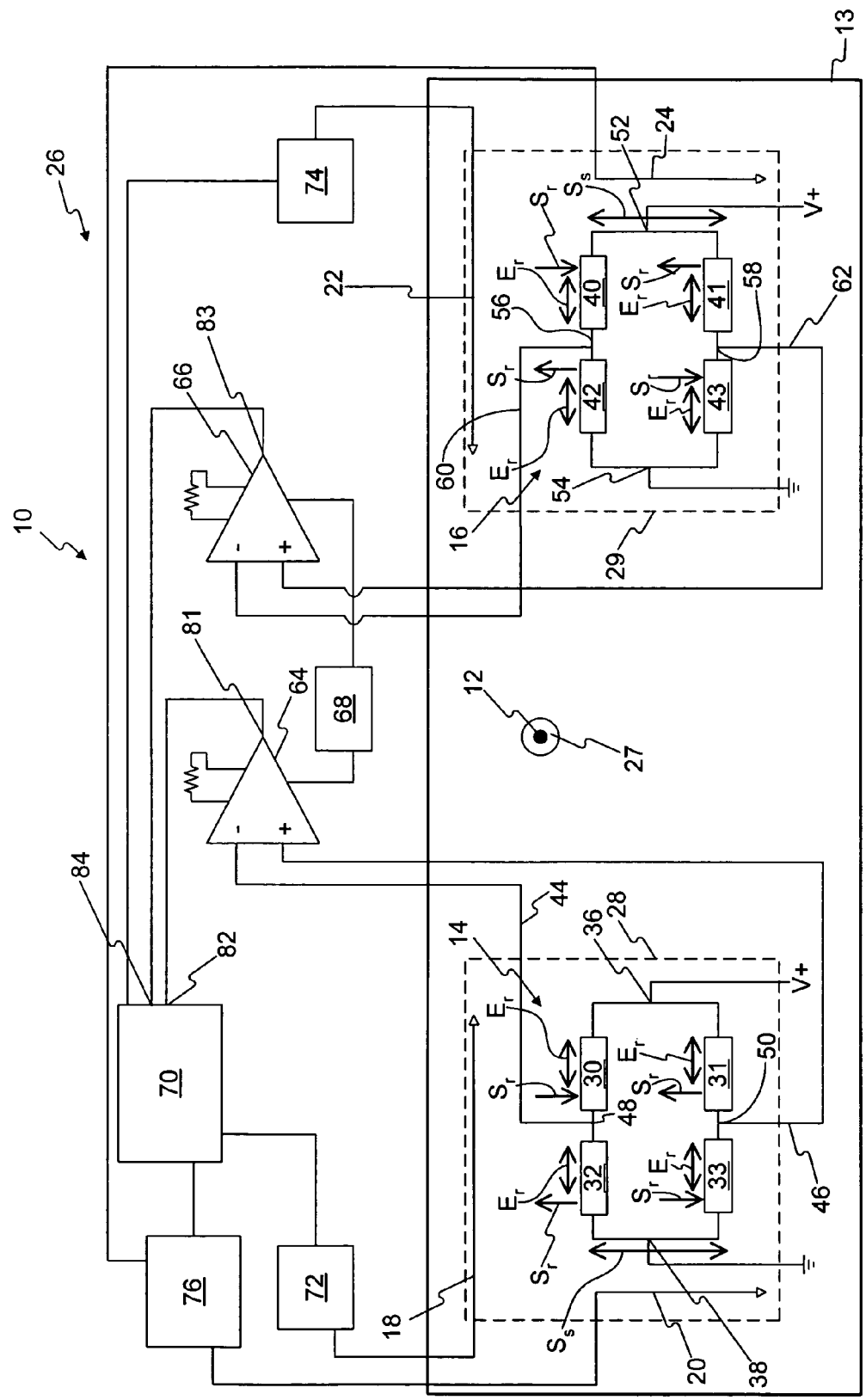
FIG. 1 is a schematic illustration of a first embodiment of an electrical system according to the present disclosure.

FIG. 1 illustrates one embodiment of an electrical system 10 according to the present disclosure. Electrical system 10 may include an electrical conductor 12, a frame 13, magnetoresistive sensors 14, 16, electrical conductors 18, 20, 22, 24, and a control circuit 26. Electrical conductor 12 may be any type of structure configured to carry electrical current, including, but not limited to, a wire, a bus bar, and a trace in a monolithic integrated circuit. Electrical conductor 12 may extend through an aperture 27 in frame 13.

Magnetoresistive sensors 14, 16 and electrical conductors 18, 20, 22, 24 may be mounted to frame 13. Magnetoresistive sensors 14, 16 may be substantially equidistant from electrical conductor 12. Electrical conductors 18, may be disposed proximate magnetoresistive sensor 14, and electrical conductors 22, 24 may be disposed proximate magnetoresistive sensor 16. As FIG. 1 shows, in some embodiments, magnetoresistive sensor 14, electrical conductor 18, and electrical conductor 20 may be part of a monolithic integrated circuit 28. Similarly, magnetoresistive sensor 16, electrical conductor 22, and electrical conductor 24 may be part of a monolithic integrated circuit 29.

Each magnetoresistive sensor 14, 16 may be any type of component having at least one magnetoresistor connected to at least one other electrical circuit element in a manner enabling the magnetoresistive sensor 14, 16 to sense magnetic flux and produce an output signal relating to the sensed magnetic flux. As FIG. 1 shows, in some embodiments, each magnetoresistive sensor may include a plurality of magnetoresistors 30, 31, 32, 33 and 40, 41, 42, 43. Each magnetoresistor 30-33, 40-43 may be constructed in any manner that provides a relatively strong correlation between the strength of magnetic flux flowing in a sensitive direction $S_r$ of the magnetoresistor 30-33, 40-43 and the electrical resistance of the magnetoresistor 30-33, 40-43. In some embodiments, each magnetoresistor 30-33, 40-43 may be constructed of Permalloy. Additionally, in some embodiments, each magnetoresistor 30-33, 40-43 may be constructed with "barber pole" biasing. As is shown in FIG. 1, each magnetoresistor 30-33, 40-43 may be constructed such that it has anisotropic sensitivity to magnetic flux.

As FIG. 1 shows, magnetoresistors 30-33 may be arranged in a wheatstone bridge. An input terminal 36 of the wheatstone bridge may be connected to a power source, such as a constant-voltage DC power source. An output terminal 38 of the wheatstone bridge may be connected to ground, either directly or with one or more other circuit elements connected between output terminal 38 and ground. The "easy" axes $E_r$ and sensitive directions $S_r$ of magnetoresistors 30-33 may be oriented so that a sensitive direction $S_s$ of magnetoresistive sensor 14 extends at an angle to electrical conductor 12. As shown in FIG. 1, in some embodiments, the sensitive directions $S_r$ of magnetoresistors 30 and 33 may be substantially the same, and the sensitive directions $S_r$ of magnetoresistors 31 and 32 may be substantially the same and substantially opposite those of magnetoresistors 30 and 33. Additionally, magnetoresistors 30 and 31 may have substantially equal default electrical resistances (their electrical resistances when not exposed to magnetic flux), and magnetoresistors 32 and 33 may also have substantially equal default electrical resistances.

Additionally, magnetoresistive sensor 14 may include electrical conductors 44, 46 connected to intermediate terminals 48, 50 of the wheatstone bridge. As is discussed in more detail below, in the embodiment shown in FIG. 1, electrical conductors 44, 46 may collectively supply control circuit 26 with an output signal relating to the magnetic flux sensed by magnetoresistive sensor 14.

Similar to magnetoresistive sensor 14, magnetoresistive sensor 16 may have its magnetoresistors 40-43 arranged in a wheatstone bridge having an input terminal 52 connected to a power source, an output terminal 54 connected to ground, electrical conductors 60, 62 connected to intermediate terminals 56, 58. Additionally, as FIG. 1 shows, the sensitive directions $S_r$ of magnetoresistors 40-43 and the sensitive direction $S_s$ of magnetoresistive sensor 16 may be oriented similar to those of magnetoresistors 30-33 and magnetoresistive sensor 16.

Magnetoresistive sensors 14, 16 are not limited to the configurations shown in FIG. 1 and discussed above. For example, a magnetoresistive sensor 14, 16 may include more or less magnetoresistors than shown in FIG. 1. In some embodiments, a magnetoresistive sensor 14, 16 may include a conventional resistor in place of one or more of the magnetoresistors 30-33, 40-43 shown in FIG. 1. Additionally, in some embodiments, the magnetoresistors of a magnetoresistive sensor 14, 16 may be arranged in a different configuration of bridge than shown in FIG. 1. Furthermore, in some embodiments, the magnetoresistors of a magnetoresistive sensor 14, 16 may be arranged in a configuration other than a bridge. For example, a magnetoresistive sensor 14, 16 may include a single magnetoresistor connected in series with one or more conventional resistors. Additionally, electrical system 10 may omit one of magnetoresistive sensors 14, 16 or include additional magnetoresistive sensors not shown in FIG. 1. Furthermore, in some embodiments one or more of the magnetoresistors of magnetoresistive sensors 14, 16 may have isotropic sensitivity to magnetic flux.

Each electrical conductor 18, 20, 22, 24 may be any structure configured to carry electric current. Electrical conductor 18 may be configured such that at least a portion of magnetic flux generated by electric current in electrical conductor 18 flows at least partially in or opposite the sensitive direction $S_r$ of at least one magnetoresistor 30-33. For example, as FIG. 1 shows, in some embodiments, electrical conductor 18 may have one or more portions that extend perpendicular to the sensitive direction $S_r$ of each magnetoresistor 30-33. Electrical conductor 20 may be configured such that at least a portion of magnetic flux generated by electric current in electrical conductor 20 flows at least partially along the easy axis $E_r$ of magnetoresistors 30-33. For example, as FIG. 1 shows, in some embodiments, electrical conductor 20 may have one or more portions that extend substantially perpendicular to the easy axis $E_r$ of each magnetoresistor 30-33. Electrical conductors 22, 24 may be arranged such that magnetic flux generated by electric current in electrical conductors 22, 24 has the same relationships with respect to magnetoresistors 40-43 as the above-described relationships between magnetic flux generated by electric current in electrical conductors 18, 20 and magnetoresistors 30-33.

Control circuit 26 may be connected to magnetoresistive sensors 14, 16 and electrical conductors 18, 20, 22, 24. Control circuit 26 may include any combination of electrical circuit elements operable to receive output signals produced by magnetoresistive sensors 14, 16 and control electric current in electrical conductors 18, 20, 22, 24, as described below. As FIG. 1 shows, in some embodiments, control circuit 26 may include operational amplifiers 64, 66, a reference-voltage source 68, an information processor 70, low-pass filters 72, 74, and a flipping circuit 76. Operational amplifiers 64, 66 may have inputs connected to electrical conductors 44, 46 and electrical conductors 60, 62, respectively. Additionally, reference-voltage source 68 may provide a reference voltage, such as a substantially constant DC voltage, to an input of each operational amplifier 64, 66. Outputs 81, 83 of operational amplifiers 64, 66 may be connected to inputs 82, 84 of information processor 70. Additionally, low-pass filters 72 and 74 may be connected between outputs of information processor 70 and electrical conductors 18 and 22, respectively.

Information processor 70 may be any type of circuit operable to receive output signals from operational amplifiers 64, 66 and control supply of electric current to electrical conductors 18, 22. Information processor 70 may be a digital circuit or an analog circuit. Information processor 70 may be a monolithic integrated circuit or a collection of discrete electrical circuit elements. In some embodiments, information processor 70 may be a digital microcontroller. Information processor 70 may be operable to supply pulse-width-modulated voltage to low-pass filters 72, 74. Low-pass filters 72, 74 may, in turn, convert pulse-width-modulated voltage received from information processor 70 into DC current and supply it to electrical conductors 18, 22.

Flipping circuit 76 may be connected between an output of information processor 70 and electrical conductors 20, 24. Flipping circuit 76 may be operable to cause a pulse of electric current in each electrical conductor 20, 24 when information processor 70 activates flipping circuit 76. Additionally, flipping circuit 76 may be configured such that each pulse of current it generates in electrical conductors 20, 24 flows in a direction opposite the prior pulse of current.

Control circuit 26 is not limited to the configuration shown in FIG. 1. For example, control circuit 26 may include other electrical circuit elements in addition to, or in place of, circuit elements shown in FIG. 1. Additionally, control circuit 26 may omit some of the circuit elements shown in FIG. 1. In some embodiments, control circuit 26 may include only analog circuit elements.

Additionally, electrical system 10, generally, is not limited to the configuration shown in FIG. 1. For example, electrical system 10 may omit electrical conductor 20 and/or electrical conductor 24. Additionally, electrical system 10 may include multiple electrical conductors in place of electrical conductor 18, and/or electrical system 10 may include multiple electrical conductors in place of electrical conductor 22. Furthermore, electrical system 10 may include multiple electrical conductors in place of electrical conductor 12. Additionally, in some embodiments, electrical system 10 may omit magnetoresistive sensor 16 and electrical conductor 22.

Figure 2:
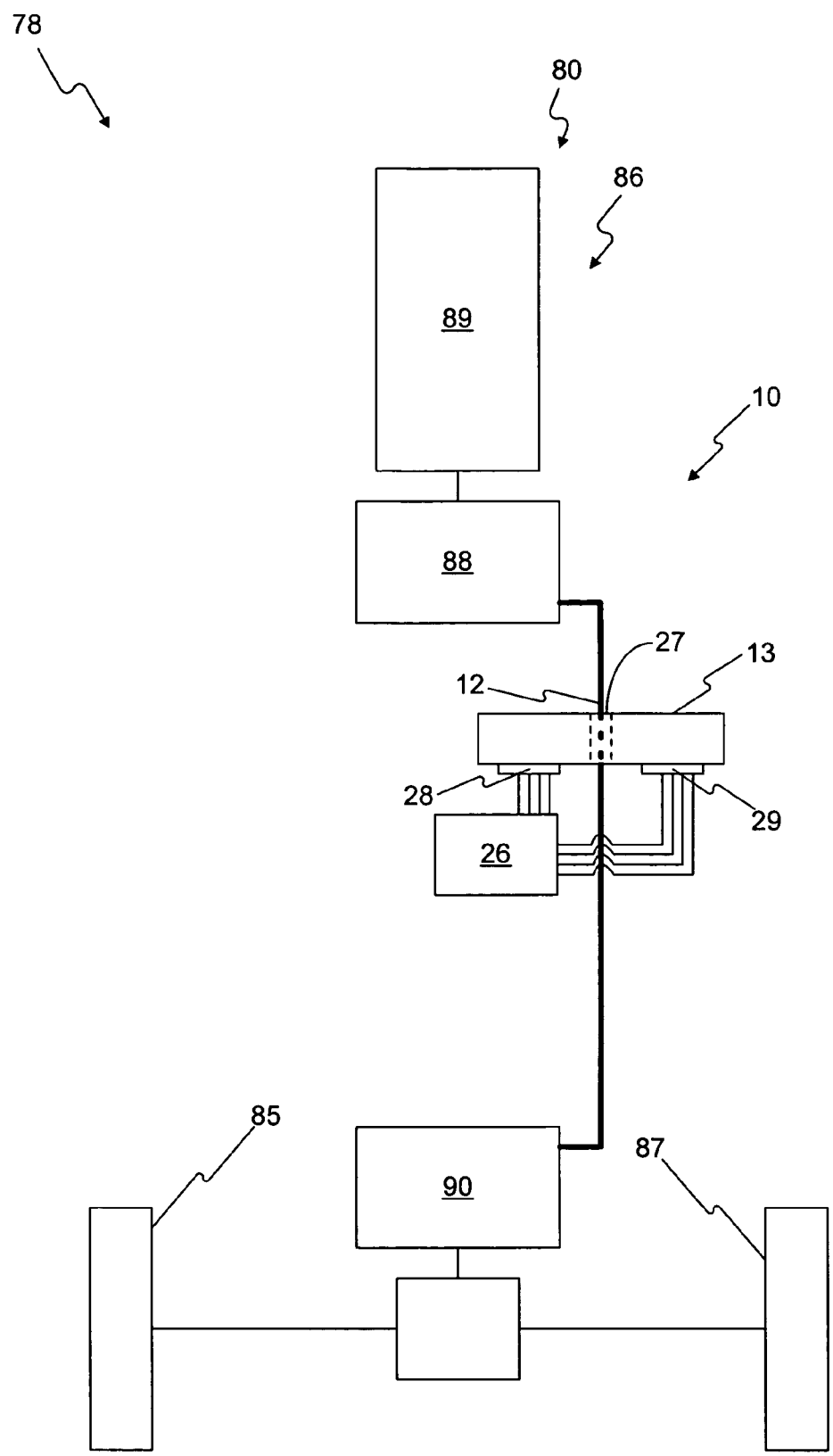
FIG. 2 is a schematic illustration of a mobile machine that includes an electrical system according to the present disclosure.

FIG. 2 shows a mobile machine 78 that includes electrical system 10. Mobile machine 78 may have a propulsion system 80 operable to propel mobile machine 78. Propulsion system 80 may include propulsion devices 85, 87 and a power-supply system 86 operatively connected to propulsion devices 85, 87. Propulsion devices 85, 87 may be any type of device configured to propel mobile machine 78 by receiving power from power-supply system 86 and transmitting at least a portion of that power to the environment surrounding mobile machine 78, including, but not limited to, wheels, track units, and propellers.

In some embodiments, such as the embodiment shown in FIG. 2, propulsion system 80 may be configured to propel mobile machine 78 at least partially with electric power, and electrical conductor 12 may be a power line of propulsion system 80. In the embodiment shown in FIG. 2, power-supply system 86 includes a prime mover 89 (such as an internal combustion engine or gas turbine), an electric motor/generator 88 drivingly connected to prime mover 89, and an electric motor/generator 90 drivingly connected to propulsion devices 85, 87. Additionally, electric motor/generator 88 and electric motor/generator 90 may be electrically connected via electrical conductor 12.

INDUSTRIAL APPLICABILITY

Electrical system 10 may have application wherever electricity is required to perform one or more tasks. Operation of electrical system 10 will be described hereinbelow.

During operation of electrical system 10, electrical conductor 12 may carry electric current between two or more components for various purposes. For example, in the implementation of electrical system 10 shown in FIG. 2, electrical conductor 12 may carry electric current from electric motor/generator 88 to electric motor/generator 90 for the purpose of providing electric motor/generator 90 with power to propel mobile machine. In many circumstances, it may be desirable to know the magnitude of electric current flowing through electrical conductor 12 for various purposes, such as for use in controlling various aspects of the operation of electrical system 10.

Figure 3:
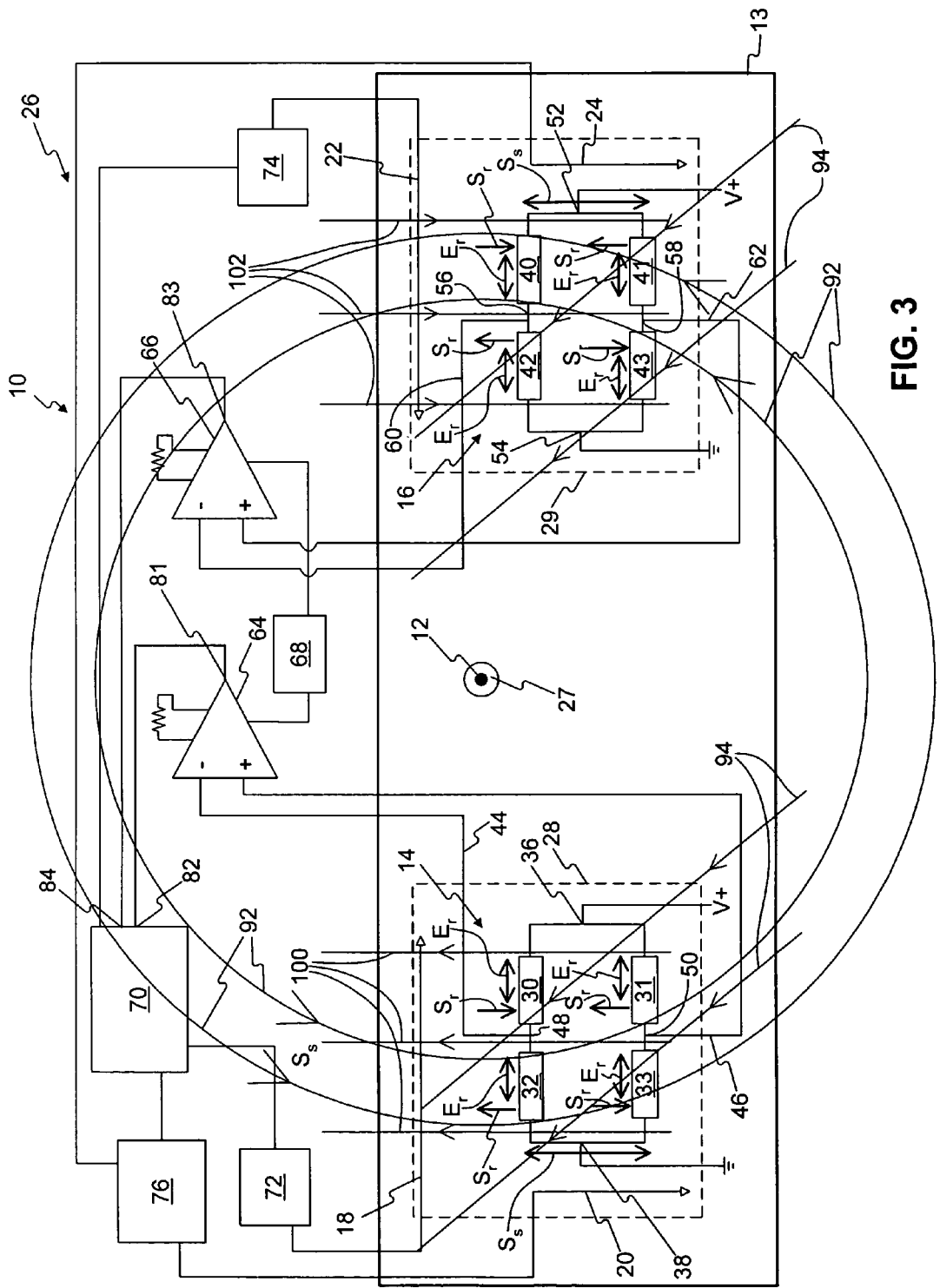
FIG. 3 shows the electrical system of FIG. 1 in operation.

When electric current flows through electrical conductor 12, magnetoresistive sensors 14, 16 may generate output signals that control circuit 26 may utilize to generate a signal relating to the magnitude of electric current flowing through electrical conductor 12. FIG. 3 shows the configuration of electrical system 10 from FIG. 1 in operation. Electric current flowing through electrical conductor 12 may generate magnetic flux 92 with a magnitude proportional to the electric current. Depending upon the direction of electric current in electrical conductor 12, magnetic flux 92 may flow counterclockwise around electrical conductor 12 or clockwise around electrical conductor 12. When magnetic flux 92 is flowing through magnetoresistive sensors 14, 16, it may affect the electrical resistance of each of the magnetoresistors of magnetoresistive sensors 14, 16 and thereby the output signal of each magnetoresistive sensor 14, 16. The degree to which the magnetic flux 92 affects the electrical resistance of the magnetoresistors of a magnetoresistive sensor and the output of that magnetoresistor will depend upon the magnitude of magnetic flux 92 and the spatial relationship between electrical conductor 12 and the magnetoresistors.

In the circumstances shown in FIG. 3, magnetic flux 92 may affect the voltage at intermediate terminals 48, 50, 56, 58 of the wheatstone bridges of magnetoresistive sensors 14, 16. In embodiments where magnetoresistors 30-33 have equal default electrical resistances, when magnetoresistive sensor 14 is not exposed to magnetic flux, each magnetoresistor 30-33 may cause an equal voltage drop, and the voltage at intermediate terminals 48, 50 may be equal. However, when magnetic flux 92 is flowing through magnetoresistors 30-33, the electrical resistances of magnetoresistors 30-33 may vary as a function of the magnitude of magnetic flux 92. This may create a voltage differential between intermediate terminals 48, 50 proportional to magnetic flux 92. In the embodiment shown in FIG. 3, this voltage differential (or the lack thereof) constitutes the output signal of magnetoresistive sensor 14. Magnetoresistive sensor 16 may similarly respond to magnetic flux 92 with a voltage differential between intermediate terminals 56, 58, which voltage differential (or the lack thereof) is its output signal.

With magnetoresistors 14, 16 arranged as shown in FIG. 3, magnetic flux 92 will always drive the output signals of magnetoresistive sensors 14, 16 in opposite directions. This is because magnetic flux 92 flows in opposite directions with respect to the sensitive directions $S_r$ of the corresponding magnetoresistors of each magnetoresistive sensor 14, 16, such as magnetoresistor 30 and magnetoresistor 40.

Ambient magnetic flux 94, such as the magnetic flux from the Earth's magnetic poles, may also affect the electrical resistance of magnetoresistors 30-33, 40-43 and, thus, the output signals of magnetoresistive sensors 14, 16. Unlike magnetic flux 92, ambient magnetic flux 94 will generally flow through all of magnetoresistors 30-33, 40-43 in the same direction (though not necessarily the direction shown in FIG. 3). As a result, ambient magnetic flux 94 will generally add to magnetic flux 92 sensed by one of magnetoresistive sensors 14, 16 while canceling some or all of magnetic flux 92 sensed by the other magnetoresistive sensors 14, 16. In the exemplary circumstances shown in FIG. 3, ambient magnetic flux 94 will add with magnetic flux 92 sensed by magnetoresistive sensor 16, and ambient magnetic flux 94 will cancel at least a portion of magnetic flux 92 sensed by magnetoresistive sensor 14.

Control circuit 26 may perform various operations with the output signals provided by magnetoresistive sensors 14, 16. Operational amplifier 64 may subtract the voltage at intermediate terminal 48 from the voltage at intermediate terminal 50, multiply the result by the gain of operational amplifier 64, add the result to the reference voltage received from reference-voltage source 68, and output the resulting voltage from output 81 to input 82 of information processor 70. Operational amplifier 66 may perform the same operations with the voltage from intermediate terminal 56 and intermediate terminal 58, and output the result from output 83 to input 84 of information processor 70.

Figure 4:
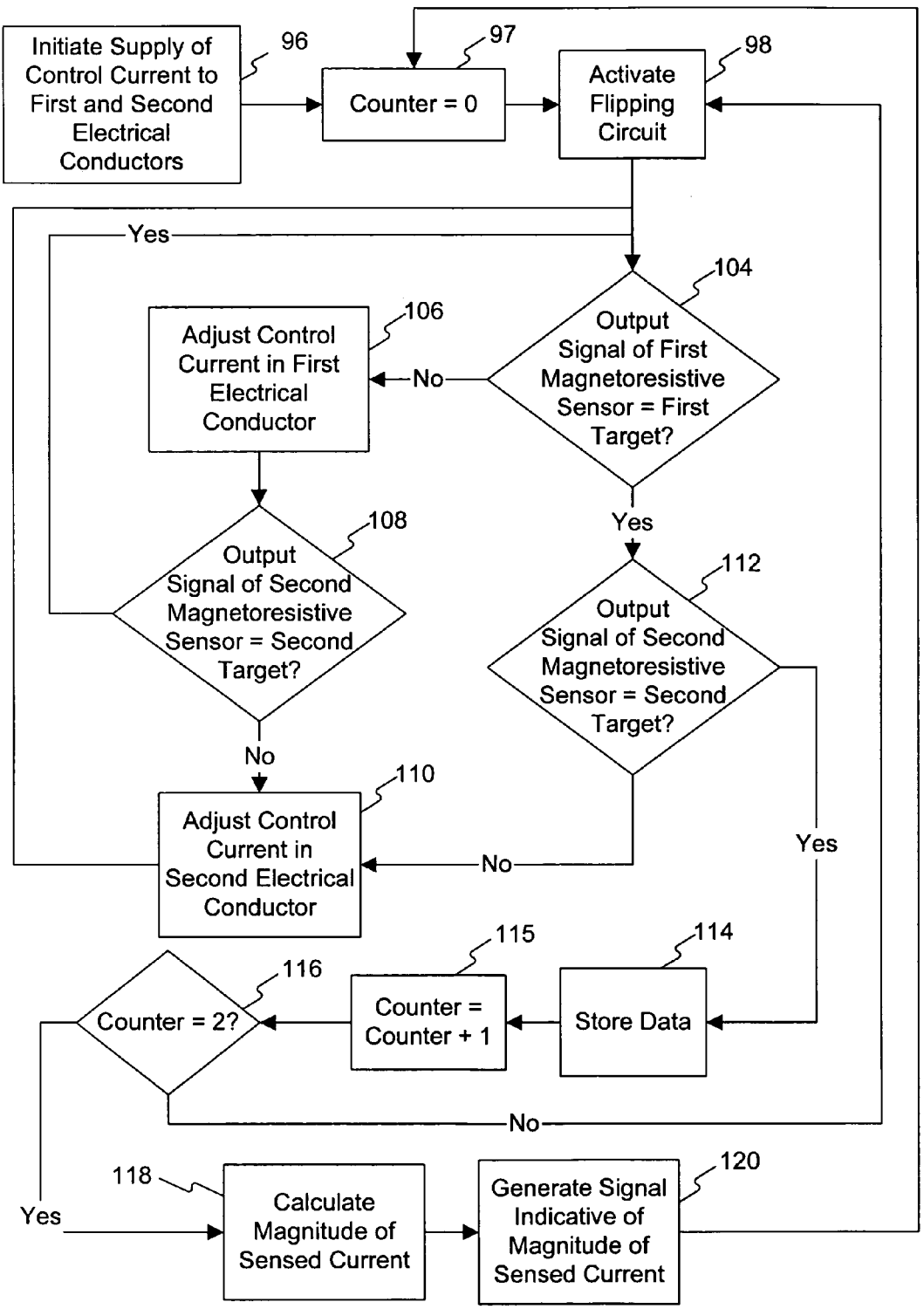
FIG. 4 is a flow chart showing one embodiment of a method of operating the electrical system according to the present disclosure.

Based on inputs from operational amplifiers 64, 66, information processor 70 may control current in electrical conductors 18, 22 and calculate the magnitude of electric current flowing through electrical conductor 12. FIG. 4 shows one embodiment of a method according to which information processor 70 may do so. Initially, information processor 70 may commence supply of control current to electrical conductors 18, 22. (step 96) For example, information processor 70 may begin supplying pulse-width-modulated control voltage to low-pass filters 72, 74, and low-pass filters 72, 74 may convert the control current into DC current and supply it to electrical conductors 18, 22. The control current flowing through electrical conductor 18 may generate control flux 100 (FIG. 3), which may flow through magnetoresistive sensor 14 and affect its output signal. Similarly, the control current in electrical conductor 16 may generate control flux 102 (FIG. 3), which may flow through magnetoresistive sensor 16 and affect its output signal.

Information processor 70 may then set a counter equal to zero. (step 97) Subsequently, information processor 70 may activate flipping circuit 76. (step 98) In response, flipping circuit 76 may cause a pulse of electric current in each electrical conductor 20, 24 having sufficient magnitude to generate a pulse of magnetic flux that reverses the sensitive direction $S_r$ of each magnetoresistor 30-33, 40-43.

Subsequently, information processor 70 may control the magnitude of control current flowing in electrical conductors 18, 22 dependent upon output signals from operational amplifiers 64, 66. Information processor 70 may calculate whether the output signal from magnetoresistive sensor 14 is equal to a first predetermined target. (step 104) Information processor 70 may do so using the output signal of operational amplifier 64 because of the known relationship between the output signal of magnetoresistive sensor 14 and the output signal of operational amplifier 64. The first predetermined target may be a singular target value, such as a value of the output signal of magnetoresistive sensor 14 corresponding to magnetoresistive sensor 14 sensing zero magnetic flux. Alternatively, the first predetermined target may be a target range, in which case the output signal of magnetoresistive sensor 14 may be considered to be equal to the first predetermined target whenever the output signal is within the range. The first predetermined target may have a fixed numerical value/fixed numerical values, or it may be defined as a function of various other factors.

If the output signal of magnetoresistive sensor 14 is not within the first predetermined target, information processor 70 may adjust the supply of control current to electrical conductor 18 to drive the output signal of magnetoresistive sensor 14 toward the first predetermined target. (step 106) In embodiments where information processor 70 delivers pulse-width-modulated voltage to low-pass filter 72, information processor 70 may adjust the control current in electrical conductor 18 by adjusting the duty cycle of the pulse-width-modulated voltage. Adjusting the control current in electrical conductor 18 may change the output signal of magnetoresistive sensor 14 by changing the magnitude of control flux 100 flowing through magnetoresistive sensor 14.

Subsequently, information processor 70 may calculate whether the output signal of magnetoresistive sensor 16 is within a second predetermined target. (step 108) Like the first predetermined target, the second predetermined target may be a singular target value or a target range. Additionally, the first predetermined target may have a fixed numerical value/fixed numerical values, or it may be defined as a function of various other factors.

If the output signal of magnetoresistive sensor 16 is not within the second predetermined target, information processor 70 may adjust the control current in electrical conductor 22 to drive the output signal of magnetoresistive sensor 16 toward the second predetermined target. (step 110)

Information processor 70 may continue adjusting the control current in one or both of electrical conductors 18, 22 until information processor 70 determines that the output signal of magnetoresistive sensor 14 is equal to the first predetermined target (step 104) and the output signal of magnetoresistive sensor 16 is equal to the second predetermined target (step 112). When these conditions are met, information processor 70 may store information relating to the present operating conditions of electrical system 10. (step 114) For example, information processor 70 may store data relating to the control current in electrical conductors 18, 22, such as the duty cycle of the pulse-width-modulated voltage delivered to low-pass filters 72, 74. Additionally, in some embodiments, information processor 70 may store the information relating to the present output signals of magnetoresistive sensors 14, 16 and/or information relating to various other operating conditions of electrical system 10.

Subsequently, information processor 70 may increment the counter (step 115) and calculate whether the counter is equal to two (step 116). If the counter is not equal to two, information processor 70 may repeat the sequence of actions beginning with activating flipping circuit 76 (step 98).

Once information processor 70 has executed this sequence twice, as indicated by information processor 70 determining that the counter is equal to two (step 116), information processor 70 may use stored data from the two cycles to calculate the electric current flowing in electrical conductor 10. (step 118) Information processor 70 may calculate the magnitude of electric current in electrical conductor 12 as a function of various factors using information relating those factors to the magnitude of electric current in electrical conductor 12. For example, information processor 70 may calculate the magnitude of the electric current in electrical conductor 12 as a function of the control currents in electrical conductors 18, 22 and the output signals of magnetoresistive sensors 14, 16. Information processor 70 may employ various algorithms to do so.

In some embodiments, when calculating the magnitude of electric current in electrical conductor 12, information processor 70 may treat the output signals from magnetoresistive sensors 14, 16 as constants, rather than variables. The exemplary algorithm discussed in detail below takes this approach. Such an approach may provide a particularly accurate estimate of the magnitude of the electric current in electrical conductor 12 in embodiments where the predetermined target for the output signal of each magnetoresistive sensor 14, 16 includes only a single target value or a relatively small range of values.

Information processor 70 may calculate the magnitude of current in electrical conductor 12 in a manner that accounts for other factors that affect the output signals of magnetoresistive sensors 14, 16. One such factor may be variation of magnetoresistors 30-33 from their design specifications. As mentioned above, magnetoresistors 30 and 31 may be designed to have exactly equal default resistance, and magnetoresistors 32 and 33 may be designed to have exactly equal default resistance. If this design goal is actually achieved, intermediate terminals 48, 50 will be at equal voltages when no magnetic flux flows through magnetoresistors 30-33, and any voltage differential between intermediate terminals 48, 50 will be a function of sensed magnetic flux. However, in practice, manufacturing variations will generally cause some unknown amount of imbalance between the default resistances of magnetoresistors 30 and 31 and some unknown imbalance between the default resistances of magnetoresistors 32 and 33. This may cause an unknown voltage difference between intermediate terminals 48, 50 that is not attributable to sensed magnetic flux. This voltage difference is often referred to as "bridge offset." Magnetoresistive sensor 16 may also have bridge offset.

Periodically reversing the sensitive directions $S_r$ of magnetoresistors 30-33, 40-43 may create circumstances that allow information processor 70 to factor out any bridge offset. As long as input terminal 36 receives a constant voltage, any bridge offset will have a constant effect on the output signal of magnetoresistive sensor 14. By contrast, reversing the sensitive directions $S_r$ of magnetoresistors 30-33 reverses the effect of the magnetic flux 92 and 94 on the output signal of magnetoresistive sensor 14. As a result, reversing the sensitive directions $S_r$ of magnetoresistors 30-33 will cause a change in the output signal of magnetoresistive sensor 14 equal to twice the total effect of magnetic fluxes 92 and 94 on the output signal of magnetoresistive sensor 14.

Using this fact and information from before and after reversal of the sensitive directions $S_r$ of magnetoresistors 30-33, 40-43, information processor 70 may employ various algorithms to calculate a value indicative of the net magnetic flux flowing through magnetoresistors 30-33 (the vector sum of magnetic fluxes 92, 94). For example, in some embodiments, information processor 70 may calculate values X1 and X2 related to the net magnetic flux sensed by magnetoresistive sensors 14 and 16, respectively, as follows:

$$X1 = \frac{\Delta DC1}{2} \quad X2 = \frac{\Delta DC2}{2}$$

where $\Delta DC1$ is the difference between the duty cycle of pulse-width-modulated voltage delivered to low-pass filter 72 before reversal of the sensitive directions $S_r$ of magnetoresistors 30-33 and the duty cycle of pulse-width-modulated voltage delivered to low-pass filter 72 after reversal of the sensitive directions $S_r$ of magnetoresistors 30-33; and $\Delta DC2$ is the difference between the duty cycle of pulse-width-modulated voltage delivered to low-pass filter 74 before reversal of the sensitive directions $S_r$ of magnetoresistors 40-43 and the duty cycle of pulse-width-modulated voltage delivered to low-pass filter 74 after reversal of the sensitive directions $S_r$ of magnetoresistors 40-43. It should be noted that there are numerous other approaches that information processor 70 may employ to determine the effect of the net magnetic flux flowing through magnetoresistive sensors 14, 16.

Additionally, receiving information from both magnetoresistive sensor 14 and magnetoresistive sensor 16 may allow information processor 70 to factor out ambient magnetic flux 94 when calculating the magnitude of electric current in electrical conductor 12. As mentioned above, ambient magnetic flux 94 drives the output signals of both magnetoresistive sensors 14, 16 in the same direction, and magnetic flux 92 drives the output signals of magnetoresistive sensors 14, 16 in opposite directions. As a result, the difference between the output signal of magnetoresistive sensor 14 and the output signal of magnetoresistive sensor 16 corresponds to the sum of the effect of magnetic flux 92 on magnetoresistive sensor 14 and the effect of magnetic flux 92 on magnetoresistive sensor 16. Additionally, because magnetoresistive sensors 14, 16 are substantially equidistant from electrical conductor 12, the effect of magnetic flux 92 on the output signal of magnetoresistive sensor 14 may be substantially equal to the effect of magnetic flux 92 on magnetoresistive sensor 16.

Using these facts, information processor 70 may execute various algorithms for calculating the magnitude of electric current in electrical conductor 12 without bias from ambient magnetic flux 94. For example, when calculating the magnitude of electric current in electrical conductor 12, information processor 70 may calculate a value Y relating to the effect of magnetic flux 92 on each magnetoresistive sensor 14, 16 as follows:

$$Y = \frac{\text{Abs}[(X1 - X2)]}{2}$$

where X1 and X2 are the previously calculated values corresponding to the net effect of magnetic flux 92 and ambient magnetic flux 94 on the output signals of magnetoresistive sensors 14, 16, respectively. With knowledge of the effect of magnetic flux 92 on the output signal of each magnetoresistive sensor 14, 16, information processor 70 may use various calibration data to calculate the magnitude of electric current in electrical conductor 12.

After calculating the magnitude of electric current in electrical conductor 12, information processor 70 may generate a signal indicative of the magnitude of the electric current. (step 120) The signal may be an internal signal maintained within information processor 70, or information processor 70 may transmit the signal to another electrical circuit element.

Subsequently, information processor 70 may reset the counter to zero (step 97) and resume the cycle of periodically activating flipping circuit 76 (step 98), adjusting the control currents in electrical conductors 18, 22 as necessary (steps 104, 106, 108, and 110), and storing information relating to operating conditions of electrical system 10 (step 114). As information processor 70 continues to execute the algorithm shown in FIG. 4, information processor 70 may calculate the magnitude of electric current in electrical conductor 12 numerous different times. In some embodiments, information processor 70 may store each calculated value and keep a running average of the calculated values, which may help diminish the effects of noise in the data-gathering process.

Operation of electrical system 10 is not limited to the examples provided in FIG. 4 and the above discussion. For example, control circuit 26 may perform the actions discussed above in different orders than shown in FIG. 4. In some cases, control circuit 26 may perform some of the actions simultaneously. Additionally, control circuit 26 may omit some of the actions discussed above and/or execute various actions not discussed above or shown in FIG. 4.

Control circuit 26 may also execute the actions shown in FIG. 4 with different parameters and/or algorithms than those discussed above. Additionally, control circuit 26 may employ various equations and/or algorithms other than those discussed above to calculate the magnitude of electric current in electrical conductor 12.

Additionally, operation of electrical system 10 may vary from the examples discussed above in embodiments where the physical configuration of electrical system 10 differs from that shown in FIGS. 1 and 2. For example, in embodiments where electrical system 10 includes multiple electrical conductors in place of electrical conductor 12, control circuit 26 may calculate the aggregate electric current flowing in those electrical conductors and/or generate a signal indicative of the aggregate electric current flowing in those electrical conductors. Similarly, in embodiments where electrical system 10 includes multiple electrical conductors in place of electrical conductor 18 and/or multiple electrical conductors in place of electrical conductor 22, control circuit 26 may coordinate control current in those multiple electrical conductors as necessary to achieve the same results as discussed above. Additionally, various electrical circuit elements other than information processor 70 may perform some or all of the actions discussed above.

The disclosed embodiments may enable accurately sensing a wide range of current in electrical conductor 12. By using control current in electrical conductors 18, 22 to adjust the output signals of magnetoresistive sensors 14, 16 into predetermined targets, control circuit 26 may ensure operation of magnetoresistive sensors 14, 16 in operating ranges wherein they provide reliable output signals. Whenever magnetoresistive sensors 14, 16 are within such operating ranges, the magnitude of electric current in electrical conductor 12 may be accurately calculated as a function of the control currents in electrical conductors 18, 22 and the output signals of magnetoresistive sensors 14, 16. The ability of control circuit 26 to ensure operation of magnetoresistive sensors 14, 16 within such operating ranges is limited only by limits on the ability of control circuit 26 to adjust the control current in electrical conductors 18, 22. Accordingly, only the limits of the ability of control circuit 26 to adjust the control currents in electrical conductors 18, 22 limit the range of current that can be accurately sensed.

Additionally, incorporating electrical conductors 18, 20 in monolithic integrated circuit 28 with magnetoresistive sensor 14, as well as incorporating electrical conductors 22, 24 in monolithic integrated circuit 29 with magnetoresistive sensor 16 may provide various benefits. Constructing electrical system 10 in this manner may avoid component cost associated with separately providing electrical conductors 18, 20, 22, 24 and magnetoresistive sensors 14, 16. Additionally, this construction may promote precise location of electrical conductors 18, 20 and electrical conductors 22, 24 with respect to magnetoresistive sensors 14 and 16, respectively, which may facilitate accurate calculation of the current in electrical conductor 12. Furthermore, this construction may enable placing electrical conductors 18, 20 and 22, 24 very close to magnetoresistive sensors 14 and 16, respectively, which may limit the amount of current necessary in electrical conductors 18, 20, 22, 24 to achieve the above-described functions.

Additionally, employing a digital information processor to adjust the control currents in electrical conductors 18, 22, calculate the magnitude of electric current in electrical conductor 12, and generate a signal indicative of the calculated magnitude of the current may provide certain advantages. A digital information processor may be able to calculate the magnitude of the current and generate a signal indicative of the magnitude of the current with very high resolution. Additionally, a digital information processor may be able to generate a signal that may be readily communicated to other digital information processors for use in various monitoring and/or control processes.

It will be apparent to those skilled in the art that various modifications and variations can be made in the electrical system and methods without departing from the scope of the disclosure. Other embodiments of the disclosed electrical system and methods will be apparent to those skilled in the art from consideration of the specification and practice of the electrical system and methods disclosed herein. It is intended that the specification and examples be considered as exemplary only, with a true scope of the disclosure being indicated by the following claims and their equivalents.

What is claimed is:

1. An electrical system, comprising:
   a first monolithic integrated circuit, including a first magnetoresistive sensor operable to sense magnetic flux and produce an output signal relating to the sensed magnetic flux, the first magnetoresistive sensor being positioned to sense
     first control flux generated by control current in one or more electrical conductors of the first monolithic integrated circuit, and
     flux generated by sensed electric current flowing through one or more additional electrical conductors; and
   a control circuit operable to receive the output signal of the first magnetoresistive sensor and adjust the control current that generates the first control flux in a manner to cause the output signal from the first magnetoresistive sensor to substantially coincide with a predetermined target.

2. The electrical system of claim 1, wherein the first magnetoresistive sensor includes a plurality of magnetoresistors arranged in a wheatstone bridge.

3. The electrical system of claim 1, wherein the first predetermined target is a single value corresponding to the first magnetoresistive sensor sensing zero magnetic flux.

4. The electrical system of claim 1, wherein the control circuit includes a digital information processor operable to control the electric current that generates the first control flux.

5. The electrical system of claim 1, further including
   a second monolithic integrated circuit, including a second magnetoresistive sensor connected to the control circuit, the second magnetoresistive sensor being operable to sense magnetic flux and produce an output signal relating to the magnetic flux sensed, the second magnetoresistive sensor being positioned to sense
second control flux generated by electric current in one or more electrical conductors of the second monolithic circuit, and
the magnetic flux generated by the sensed electric current; and
wherein the first magnetoresistive sensor and the second magnetoresistive sensor are substantially equidistant from the one or more additional electrical conductors.

6. The electrical system of claim 1, wherein the control circuit is further configured to generate a signal indicative of the magnitude of the sensed electric current, the signal indicative of the magnitude of the sensed electric current being at least partially a function of the electric current generating the first control flux.

7. The electrical system of claim 1, wherein:
the electrical system is part of a mobile machine having a propulsion system configured to propel the mobile machine at least partially with electric power; and
the one or more additional electrical conductors carrying the sensed electric current include a power line of the propulsion system.

8. An electrical system, comprising:
a magnetoresistive sensor operable to sense magnetic flux and provide an output signal relating to the sensed magnetic flux, the magnetoresistive sensor being positioned to sense
flux generated by sensed electric current flowing through one or more electrical conductors,
control flux generated by control current flowing through one or more additional electrical conductors; and
a control circuit having a digital information processor operable to adjust the control current in the one or more additional electrical conductors in a manner to cause the signal from the magnetoresistive sensor to substantially coincide with a predetermined target.

9. The electrical system of claim 8, wherein:
the control circuit includes a low-pass filter connected between the digital information processor and one or more of the additional electrical conductors; and
the digital information processor is configured to deliver pulse-width-modulated voltage to the low-pass filter and to control the magnitude of the control current by controlling the duty cycle of the pulse-width-modulated voltage.

10. The electrical system of claim 9, wherein the digital information processor is operable to generate a signal indicative of the magnitude of the sensed electric current, the signal indicative of the magnitude of the sensed electric current being at least partially a function of the duty cycle of the pulse-width-modulated voltage.

11. An electrical system, comprising:
a first monolithic integrated circuit, including a first magnetoresistive sensor operable to sense magnetic flux and produce an output signal relating to the sensed magnetic flux, the first magnetoresistive sensor being positioned to sense
first control flux generated by control current in one or more electrical conductors of the first monolithic integrated circuit, and
flux generated by sensed electric current flowing through one or more additional electrical conductors; and
a control circuit operable to receive the output signal of the first magnetoresistive sensor and adjust the control current that generates the first control flux in order to maintain the output signal from the first magnetoresistive sensor within a predetermined target range.

12. The electrical system of claim 11, wherein the control circuit is operable to periodically reverse a sensitive direction of one or more magnetoresistors of the first magnetoresistive sensor with periodic pulses of electric current in the first magnetoresistive sensor.

13. The electrical system of claim 12, wherein the control circuit includes a digital information processor operable to control the control current that generates the first control flux.

14. The electrical system of claim 13, wherein:
the electrical system is part of a mobile machine having a propulsion system configured to propel the mobile machine at least partially with electric power; and
the one or more additional electrical conductors carrying the sensed electric current include a power line of the propulsion system.

15. The electrical system of claim 11, wherein the control circuit includes a digital information processor operable to control the electric current that generates the first control flux.

16. The electrical system of claim 11, wherein the control circuit is operable to generate a signal indicative of a magnitude of the sensed electric current, the signal indicative of the magnitude of the sensed electric current being at least partially a function of the electric current generating the first control flux.

17. The electrical system of claim 11, further including:
a second monolithic integrated circuit, including a second magnetoresistive sensor connected to the control circuit, the second magnetoresistive sensor being operable to sense magnetic flux and produce an output signal relating to the magnetic flux sensed, the second magnetoresistive sensor being positioned to sense
second control flux generated by control current in one or more electrical conductors of the second monolithic circuit, and
the magnetic flux generated by the sensed electric current;
wherein the first magnetoresistive sensor and the second magnetoresistive sensor are substantially equidistant from the first electrical conductor; and
wherein the control circuit is operable to generate a signal indicative of a magnitude of the sensed electric current based at least in part on the control current that generates the first control flux and the control current that generates the second control flux.

18. An electrical system, comprising:
a monolithic integrated circuit, including a magnetoresistive sensor having one or more magnetoresistors, the magnetoresistive sensor being operable to sense magnetic flux and produce an output signal relating to the sensed magnetic flux, wherein the magnetoresistive sensor is positioned to sense
control flux generated by control current in one or more electrical conductors of the monolithic integrated circuit, and
flux generated by sensed electric current flowing through one or more additional electrical conductors; and
a control circuit operable to
receive the output signal of the magnetoresistive sensor and adjust the control current that generates the control flux in a manner to cause the output signal from the magnetoresistive sensor to substantially coincide with a predetermined target, and periodically reverse a sensitive direction of one or more of the magnetoresistors of the magnetoresistive sensor with periodic pulses of electric current in the monolithic integrated circuit.

19. The electrical system of claim 18, wherein:

the one or more magnetoresistors of the magnetoresistive sensor include a plurality of magnetoresistors arranged in a wheatstone bridge; and the control circuit is operable to periodically reverse a sensitive direction of each of the magnetoresistors in the wheatstone bridge with periodic pulses of electric current in the monolithic integrated circuit.

20. The electrical system of claim 19, wherein the control circuit is operable to generate a signal indicative of the magnitude of the sensed electric current based at least in part on a magnitude of the control current during at least two consecutive intervals between the periodic pulses of electric current used to reverse the sensitive direction of the magnetoresistors in the wheatstone bridge.

21. The electrical system of claim 18, wherein the control circuit is operable to generate a signal indicative of a magnitude of the sensed electric current based at least in part on a magnitude of the control current during at least two consecutive intervals between the periodic pulses of electric current used to reverse the sensitive direction of one or more of the magnetoresistors of the magnetoresistive sensor.

22. The electrical system of claim 18, wherein the control circuit includes a digital information processor operable to control the electric current that generates the first control flux.

23. A mobile machine, comprising: an electrical system, wherein at least part of the electrical system forms at least part of a propulsion system configured to propel the mobile machine at least in part with electricity, the electrical system including a monolithic integrated circuit, including a magnetoresistive sensor operable to sense magnetic flux and produce an output signal relating to the sensed magnetic flux, the magnetoresistive sensor being positioned to sense control flux generated by control current in one or more electrical conductors of the monolithic integrated circuit, and flux generated by sensed electric current flowing through one or more additional electrical conductors, the one or more additional electrical conductors including a power line of the propulsion system; and a control circuit operable to receive the output signal of the magnetoresistive sensor and adjust the control current that generates the control flux in a manner to cause the output signal from the magnetoresistive sensor to substantially coincide with a predetermined target.

24. The mobile machine of claim 23, wherein the control circuit is operable to periodically reverse a sensitive direction of one or more magnetoresistors of the magnetoresistive sensor with periodic pulses of electric current in the monolithic integrated circuit.

25. The mobile machine of claim 23, wherein adjusting the control current that generates the control flux in a manner to cause the output signal from the magnetoresistive sensor to substantially coincide with a predetermined target includes adjusting the control current that generates the first control flux in order to maintain the output signal from the first magnetoresistive sensor within a predetermined target range.

* * * * *

UNITED STATES PATENT AND TRADEMARK OFFICE
CERTIFICATE OF CORRECTION

PATENT NO. : 7,388,372 B2 Page 1 of 1
APPLICATION NO. : 11/443054
DATED : June 17, 2008
INVENTOR(S) : Marchand It is certified that error appears in the above-identified patent and that said Letters Patent is hereby corrected as shown below:

Please correct the Specification as follows:
Column 3, line 8, after "18," insert -- 20 --.

Signed and Sealed this

Fourth Day of November, 2008

JON W. DUDAS
*Director of the United States Patent and Trademark Office*